United States Patent [19]
Suzuki

[11] 3,989,955
[45] Nov. 2, 1976

[54] LOGIC CIRCUIT ARRANGEMENTS USING INSULATED-GATE FIELD EFFECT TRANSISTORS

[75] Inventor: Yasoji Suzuki, Kanagawa, Japan

[73] Assignee: Tokyo Shibaura Electric Co., Ltd., Kawasaki, Japan

[22] Filed: Mar. 18, 1976

[21] Appl. No.: 668,056

Related U.S. Application Data

[62] Division of Ser. No. 400,538, Sept. 25, 1973, abandoned.

[30] Foreign Application Priority Data

Sept. 30, 1972 Japan............................. 47-97682
Nov. 11, 1972 Japan............................. 47-112557

[52] U.S. Cl. ........................... 307/205; 307/208; 307/214; 307/215; 307/218; 307/279

[51] Int. Cl.² ............... H03K 19/08; H03K 19/20; H03K 19/34; H03K 19/36

[58] Field of Search .......... 307/205, 208, 214, 215, 307/218, 238, 246, 251, 269, 279, 304

[56] References Cited
UNITED STATES PATENTS

| 3,573,487 | 4/1971 | Polkinghorn | 307/205 |
| 3,573,498 | 4/1971 | Ahrons | 307/205 X |
| 3,573,507 | 4/1971 | Eng | 307/279 |
| 3,588,527 | 6/1971 | Cricchi | 307/251 X |
| 3,641,511 | 2/1972 | Cricchi et al. | 307/279 X |
| 3,714,466 | 1/1973 | Spence | 307/251 X |
| 3,720,841 | 3/1973 | Suzuki | 307/251 X |
| 3,739,193 | 6/1973 | Pryor | 307/205 |
| 3,745,371 | 7/1973 | Suzuki | 307/221 C |
| 3,766,408 | 10/1973 | Suzuki et al. | 307/279 X |

OTHER PUBLICATIONS

Reynolds et al., "Metal–Oxide–Semiconductor(MOS) Integrated Circuits"; Post. Off. Elect. Engrs. J.(G.B.); vol. 63, pt. 2 (7/1970); pp. 105–112.
Saffir, "Getting More Speed From MOS"; Electronics (pub.); 2/17/69; pp. 106–109.
Lohman, "Applications of MOSFETs in Microelectronics"; SCP and Solid State Technology (pub.); 3/1966; pp. 23–29.

Primary Examiner—John S. Heyman
Assistant Examiner—Larry N. Anagnos
Attorney, Agent, or Firm—Flynn & Frishauf

[57] ABSTRACT

A clock pulse-controlled logic circuit arrangement wherein the source-drain path of a first transistor having its gate electrode supplied with a clock pulse and the source-drain paths of at least two second transistors jointly constituting a logic gate by having the respective gate electrodes supplied with data input are connected in series between a first and a second operating voltage supply point. To the junction of the first transistor and logic gate or an output point is connected an operation stabilizing circuit for replenishing the output point with a voltage signal having the same polarity as the output voltage signal to prevent any change in the level of the output voltage signal while the first transistor is rendered nonconducting.

4 Claims, 12 Drawing Figures

LOGIC CIRCUIT ARRANGEMENTS USING INSULATED-GATE FIELD EFFECT TRANSISTORS

This is a division of application Ser. No. 400,538, filed Sept. 25, 1973, now abandoned.

This invention relates to a logic circuit or read only memory using insulated-gate field effect transistors, thereby admitting of easy integration.

A logic circuit known to date which only consumes a small amount of power is a complementary symmetry type using complementary insulated-gate field effect transistors. Such type of logic circuit requires a complementary pair of transistors per data input and includes a large number of transistors as a whole. Also known is a clock pulse-controlled logic circuit which can reduce a requirement of transistors. However, this clock pulse-controlled logic circuit presents difficulties in maintaining a normal output voltage level, in case a clock pulse has a low frequency. In the field of measuring instruments, therefore, the clock pulse-controlled logic circuit has to be applied using a clock pulse having such a low frequency as approximates zero. However, the prior art clock pulse-controlled logic circuit is unadapted for application of a clock pulse having such a low frequency.

It is accordingly the object of this invention to provide a logic circuit arrangement requiring a relatively small number of transistors and but little power and attaining a stable operation even with a clock pulse of low frequency, thereby admitting of easy integration.

According to an aspect of this invention, there is provided a logic circuit arrangement using insulated-gate field effect transistors each provided with a source-drain path and gate electrode which comprises a first transistor having its source-drain path connected between a first operating voltage supply point and an output point and its gate electrode supplied with a clock pulse, the first transistor being rendered conducting during the first section of the cycle of the clock pulse and rendered nonconducting during the second section of said cycle following said first section; a logic gate including at least two second transistors having the source-drain paths connected in series between the output point and a second operating voltage supply point, said second transistors having the gate electrodes respectively supplied with data input; and a clock pulse responsive operation stabilizing circuit means connected to the output point and actuated during at least part of the second section of the clock pulse cycle so as to supply the output point with a voltage signal having the same polarity as the voltage signal at the output point.

This invention can be more fully understood from the following detailed description when taken in connection with reference to the accompanying drawings, in which.

Figure 3:
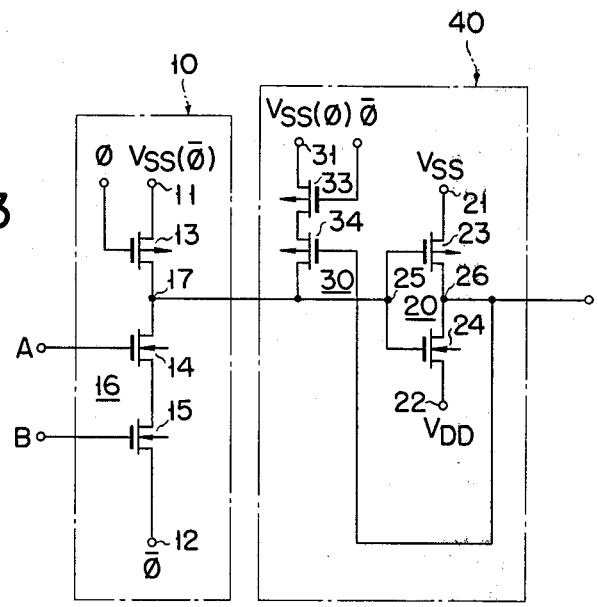
Figure 4:
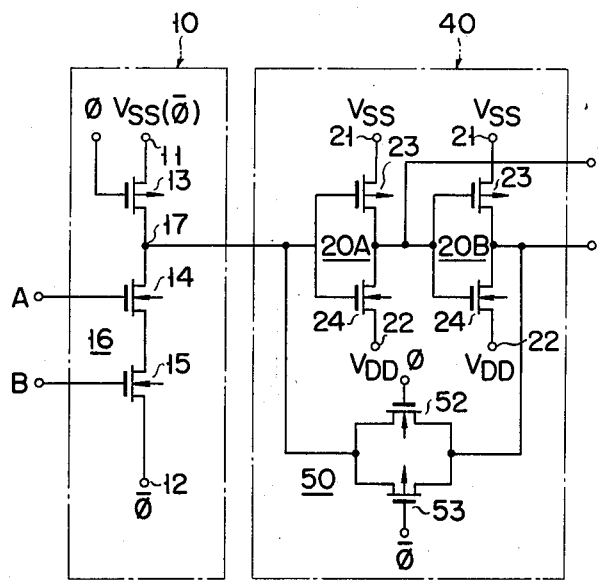
Figure 5:
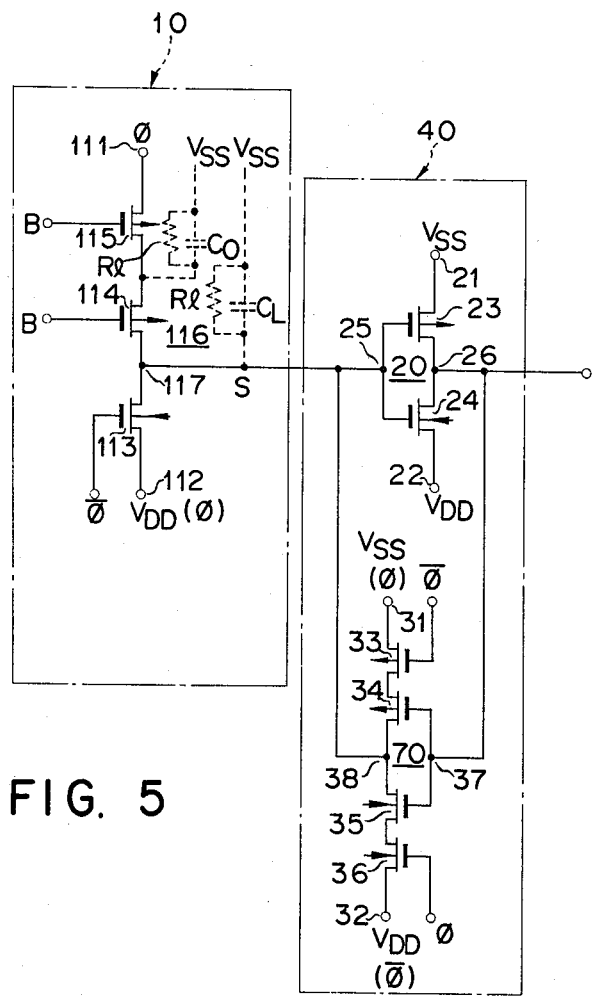
Figure 6:
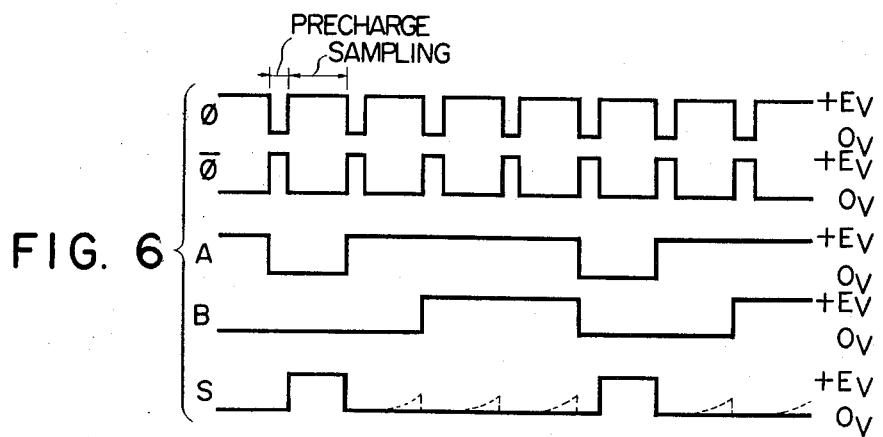
Figure 7:
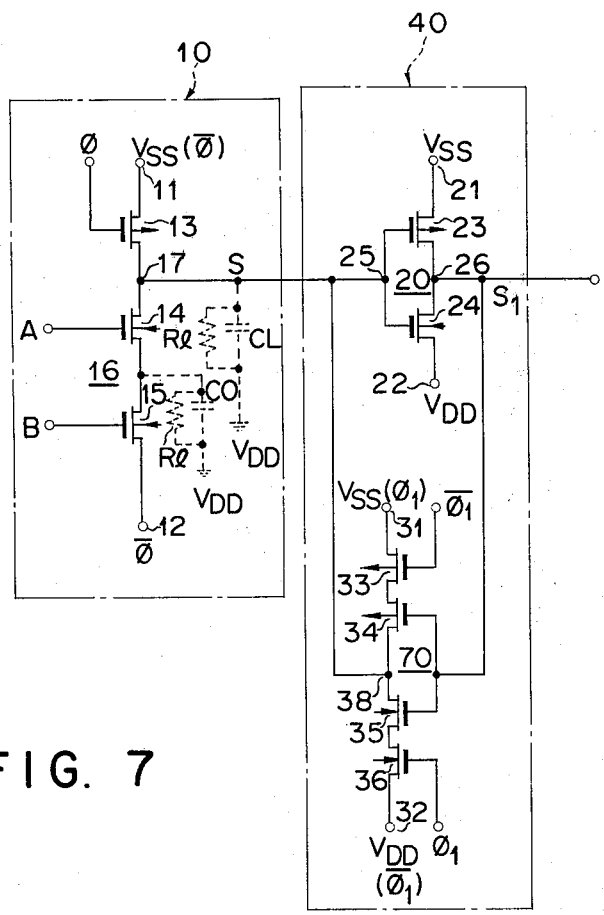
Figure 8:
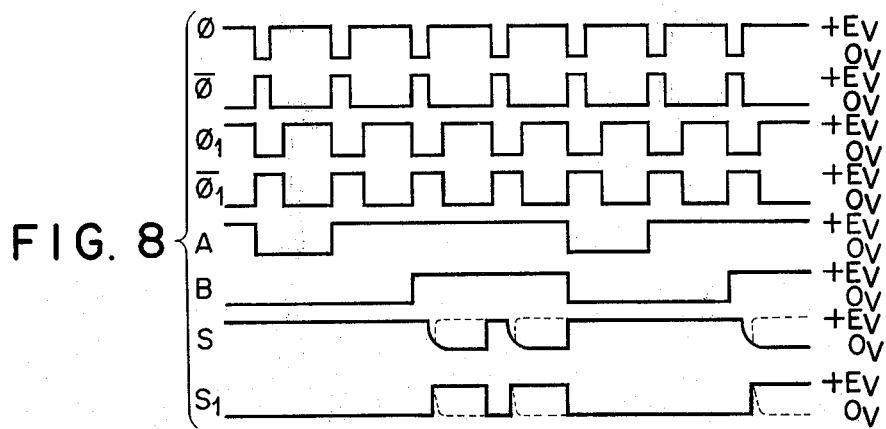
Figure 9:
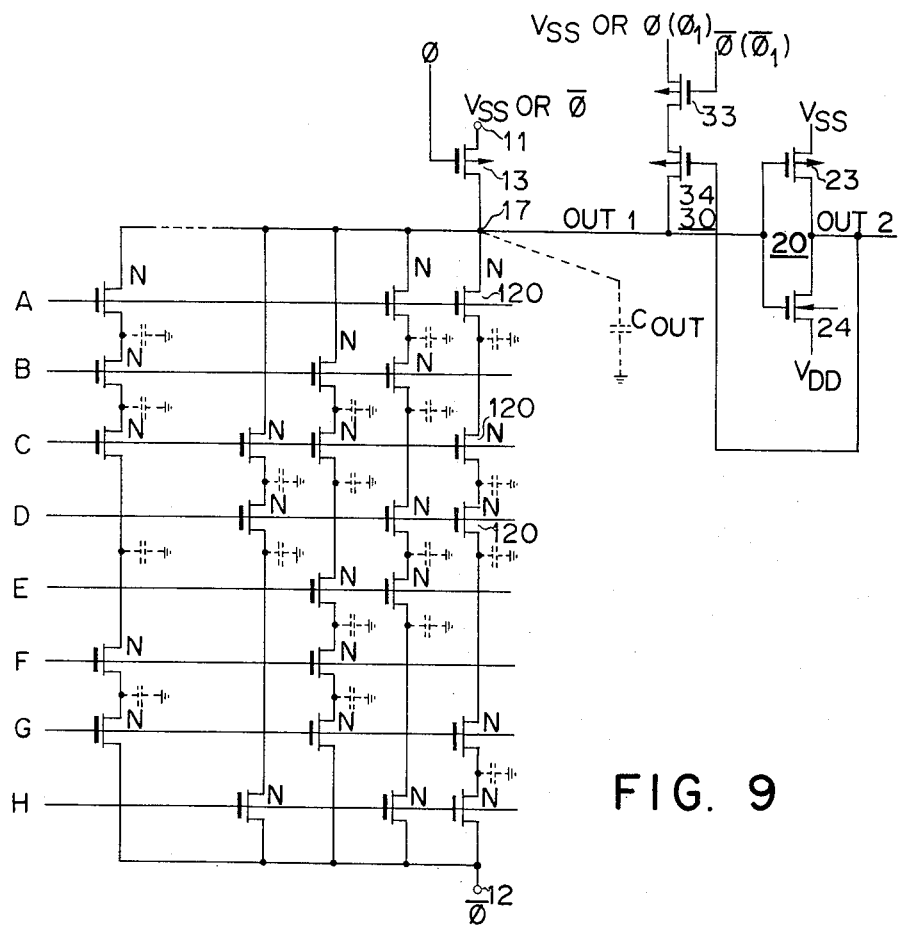
Figure 10:
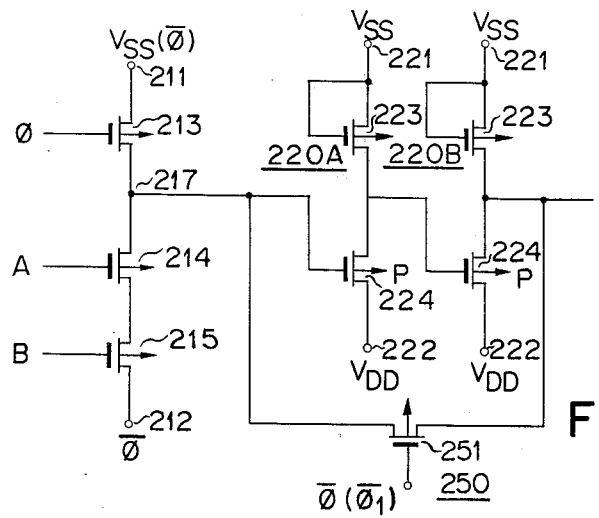
Figure 11:
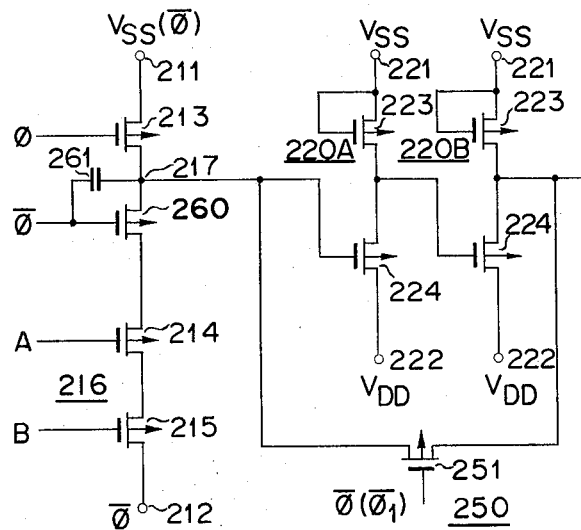
Figure 12:
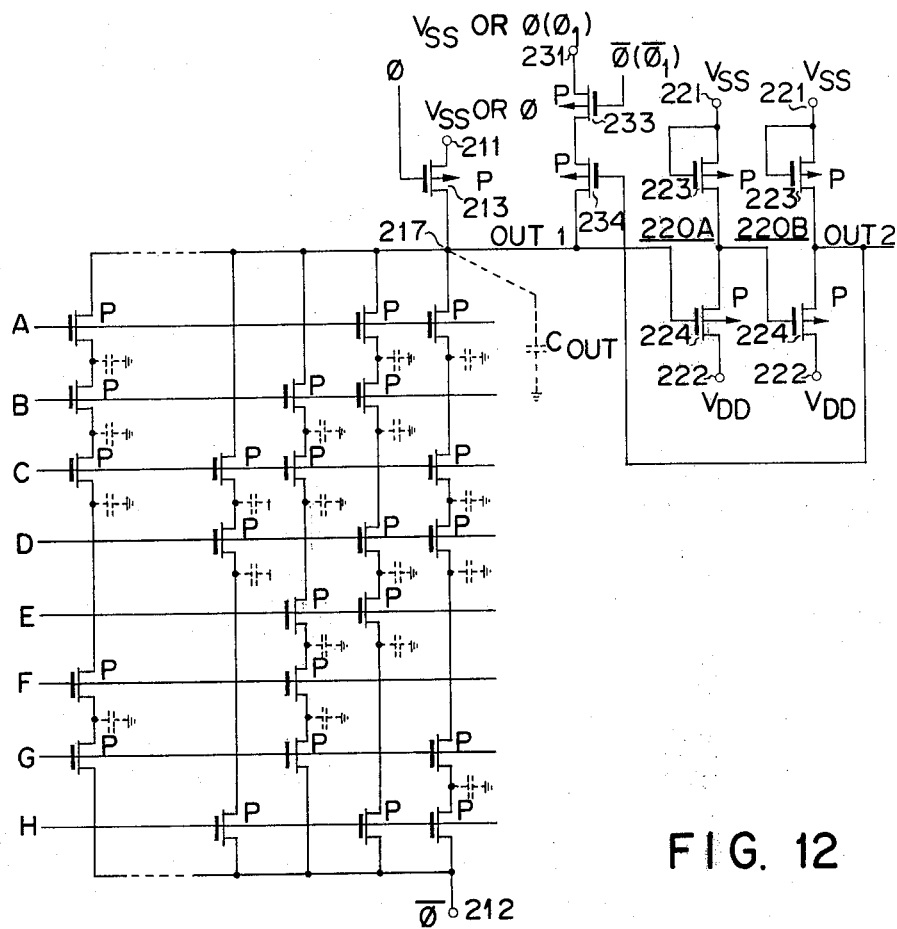

FIGS. 3 and 4 indicate logic circuits according to other embodiments of the invention;

FIG. 5 shows a logic circuit according to another embodiment of the invention;

FIG. 6 shows a waveform diagram illustrative of the operation of the logic circuit of FIG. 5;

FIG. 7 is a connection diagram of a logic circuit according to still another embodiment of the invention;

FIG. 8 presents waveforms by way of illustrating the operation of the logic circuit of FIG. 7;

FIG. 9 is a circuit diagram of a read only memory according to an embodiment of the invention;

FIGS. 10 and 11 are connection diagrams of logic circuits according to further embodiments of the invention; and FIG. 12 is a circuit diagram of a read only memory according to another embodiment of the invention.

Throughout the embodiments, description is given of a positive logic in which a high voltage level (+E volts) is denoted by a logic notation "1" and a low voltage level (0 volt) by a logic notation "0". In the case of a complementary transistor logic circuit, a P-channel transistor has its substrate supplied with a voltage of +E volts. Where, under this condition, the gate electrode of the transistor is impressed with a voltage denoted $k$, the logic "0", then the drain-source path or channel of the transistor is rendered conducting. Conversely, where the gate electrode is supplied with a "1" voltage, then the channel is rendered nonconducting. On the other hand, an N-channel transistor has its substrate grounded. Therefore, the channel of the transistor is rendered conducting when the gate electrode is impressed with a "1" voltage, and is rendered nonconducting when the gate electrode is supplied with a "0" voltage.

Figure 1:
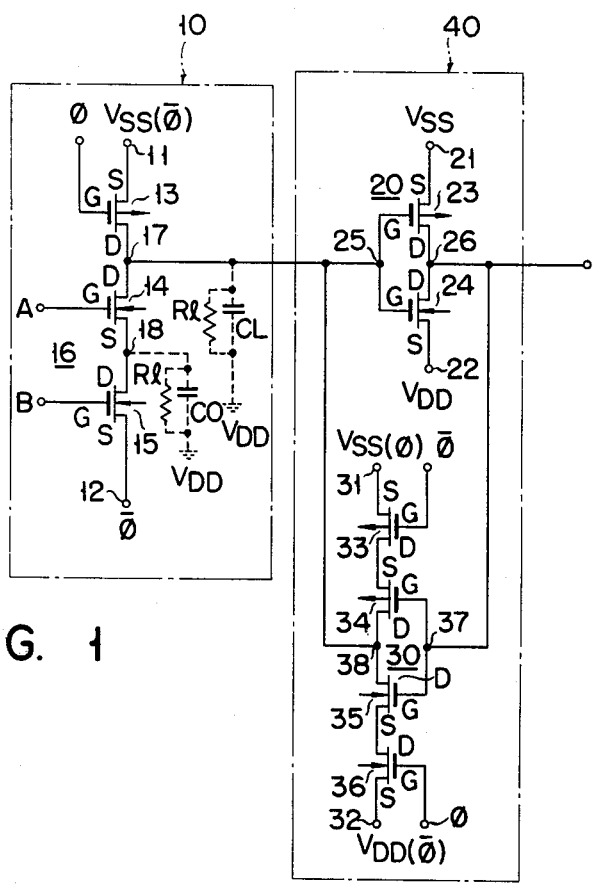
FIG. 1 is a connection diagram of a logic circuit according to an embodiment of this invention.

In a two-input NAND circuit 10 of FIG. 1, the channels of a P-channel transistor 13 and N-channel transistors 14 and 15 are connected in series between a first and a second voltage supply point 11 and 12. The gate electrodes of the N-channel transistors 14 and 15 collectively constituting a logic gate 16 are supplied with data inputs A and B respectively. The gate electrode of the P-channel transistor 13 is supplied with a clock pulse $\phi$. The first operating voltage supply point 11 is impressed with a voltage $V_{SS}$ of +E volts or a clock pulse $\bar{\phi}$ complementary to a clock pulse $\phi$. The second operating voltage supply point 12 is supplied with the complementary clock pulse $\bar{\phi}$. Output signals from the NAND circuit 10 are delivered from the junction of the channels of the transistors 13 and 14 or an output point 17. Connected to the output point 17 of the NAND circuit 10 is a complementary transistor inverter 20 of a complementary pair of transistors 23 and 24. The P-channel transistor 23 and N-channel transistor 24 have the channels connected in series between a third and fourth operating voltage supply point 21 and 22. These transistor 23 and 24 have the junction of the gate electrodes thereof or input point 25 connected to the output point 17 of the NAND circuit 10. The third operating voltage supply point 21 is impressed with a voltage $V_{SS}$ of +E volts and the fourth operating voltage supply point 22 with a voltage $V_{DD}$ of zero volt.

A clocked inverter 30 is connected to the output point of the complementary transistor inverter 20, or the junction 26 of the channels of the transistors 23 and 24. The clocked inverter 30 includes P-channel transistors 33 and 34 and N-channel transistors 35 and 36 whose channels are connected in series between a fifth and a sixth operating voltage supply point 31 and 32. The P-channel transistor 33 has its gate electrode supplied with a clock pulse $\bar{\phi}$, and the N-channel transistor 36 has its gate electrode supplied with a clock pulse $\phi$. The junction of the gate electrodes of the inverting transistors 34 and 35 or input point 37 is connected to the output point 26 of the complementary inverter 20. The junction of the channels of the inverting transistors 34 and 35 or output point 38 is connected to the input point 25 of the complementary inverter 20. The fifth operating voltage supply point 31 is supplied with a voltage $V_{ss}$ of +E volts or a clock pulse $\bar\phi$ and the sixth operating voltage supply point 32 is supplied with a voltage $V_{DD}$ of zero volt or a clock pulse $\phi$. The complementary inverter 20 and clocked inverter 30 jointly constitute an operation stabilizing circuit 40 which is designed to ensure that the NAND circuit 10 generates an output voltage at a normal level of logic "1" or "0".

Figure 2:
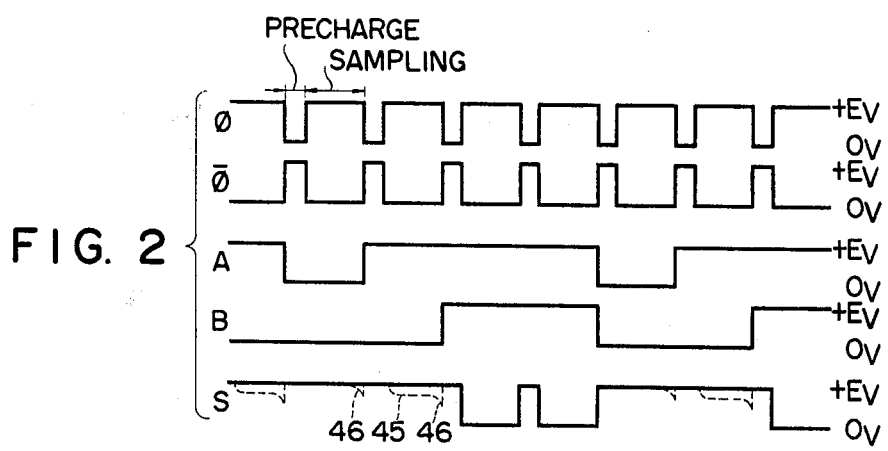
FIG. 2 represents waveforms by way of illustrating the operation of the logic circuit of FIG. 1.

There will now be described by reference to FIG. 2 the operation of the logic circuit of FIG. 1. Where a clock pulse $\phi$ has a logic "0" voltage level, then the transistor 13 has its channel rendered conducting causing a load capacitance CL distributed at the output point 17 to be charged to a voltage of +E volts. The charge enables the NAND circuit 10 to generate an output S of logic "1". The period in which the clock pulse $\phi$ continues to have a "0" voltage level, namely, the period in which the load capacitance CL is charged is hereinafter referred to as a "precharge period". When the clock pulse $\phi$ has a "1" voltage level of +E volts, the transistor 13 is rendered nonconducting. As the result, the condition of an output signal from the NAND circuit 10 is defined by that of the logic gate 16. The period in which the clock pulse $\phi$ continues to have a "1" voltage level is hereinafter referred to as a "sampling period". Where, during the sampling period, the logic transistors 14 and 15 are both rendered conducting by the data inputs A and B having a "1" voltage level, then charge stored in the capacitance CL during the precharge period is discharged through the channels of the transistors 14 and 15 to the second operating voltage supply point 12 impressed with a clock pulse $\bar\phi$ having a zero volt. As the result, the output S of the NAND circuit 10 is made to have a "0" voltage level. Where at least one of the logic transistors 14 and 15 remains nonconducting, then charge in the load capacitance CL is held during the sampling period. During the sampling period, therefore, the output S of the NAND circuit 10 may obviously be indicated by the formula: $S = \overline{A.B}$ In the NAND circuit 10, the first operating voltage supply point 11 is impressed with a voltage of +E volts during the precharge period, and the second operating voltage supply point 12 is supplied with a voltage of +E volts by a clock pulse $\bar\phi$. Therefore, even when both logic transistors 14 and 15 are rendered conducting, any direct current does not flow from the first operating voltage supply point 11 to the second operating voltage supply point 12. Therefore, the NAND circuit 10 consumes such a small amount of power as can be neglected.

Where the NAND circuit 10 holds a "1" output during the sampling period which happens to be relatively long, then the output voltage level is likely to be subject to attenuation as indicated in dotted lines in FIG. 2. This originates with the undermentioned reason.

A node capacitance CN is present between the junction of the logic transistors 14 and 15 and the ground. Where, during the precharge period, the data inputs A and B have "1" and "0" voltage levels respectively, then the transistor 13 is operated quickly at a source grounded mode, while the transistor 14 is operated slowly at a source follower mode. Accordingly, the load capacitance CL is charged up to a voltage of +E volts at a relatively quick rate, whereas the node capacitance CN can not be charged during a relatively short precharge period to a saturated voltage equal to a level arrived at by subtructing a threshold voltage Vth from the voltage of +E volts. Namely, the capacitances CL and CN are charged with different amounts of charge at the end of the precharge period. During the sampling period, therefore, the capacitance CL is likely to recharge the node capacitance CN, namely, the redistribution of charge possibly takes place. As the result, the output S of the NAND circuit 10 is attenuated, as indicated by a dotted line 45 in FIG. 2 during the first half of the sampling period. Further, the load capacitance CL and node capacitance CN have leak resistance Rl, respectively, as shown in FIG. 1. Therefore, the attenuation of the output voltage is also caused by the leak resistance Rl. Thus the output voltage is further attenuated, as indicated by a dotted line 46 in FIG. 2, during the latter half of the sampling period.

Where the sampling period is long, namely, where a clock pulse has a low frequency, the above-mentioned attenuation becomes prominent. Therefore, it is not desired to operate a logic circuit with a clock pulse of low frequency.

However, the attenuation of output voltage can be prevented by providing the operation stabilizing circuit 40 of FIG. 1, the advantageous effect of which will be described hereunder. Where, during the sampling period, the output S of the NAND circuit 10 is going to hold the "1" voltage level, the inverter 20 has its inverting transistor 24 rendered conducting to produce a "0" output at the output point 26. During the sampling period, the clocked transistors 33 and 36 of the clocked inverter 30 have the gate electrodes respectively impressed with zero volt and +E volts by clock pulses $\bar\phi$ and $\phi$ and are consequently rendered conducting. During the sampling period, therefore, the clocked inverter 30 can obviously act as an inverter. When an output signal of zero volt from the inverter 20 is supplied to the clocked inverter 30, then the inverting transistor 34 is rendered conducting to produce "1" output voltage. Since the output of the clocked inverter 30 is added to the output of the NAND circuit 10, the output point 17 of the NAND circuit 10 is additionally supplied with +E volts to prevent the attenuation in voltage of the output S of the NAND circuit 10, enabling said output signal S to have its voltage replenished and present a clean waveform indicated by a solid line in FIG. 2, instead of a dotted line waveform.

Further, where both data inputs A and B have a "1" voltage level during the sampling period, then the logic transistors 14 and 15 are rendered conducting and the NAND circuit 10 generates a "0" output signal. Accordingly, the inverting transistor 23 of the inverter 20 is actuated to give forth a "1" output signal. Since, at this time, the inverting transistor 35 of the clocked inverter 30 is rendered conducting to generate a "0" output signal, the output of the NAND circuit 10 is replenished by a "0" output of the clocked inverter 30.

FIG. 3 is a connection diagram of a logic circuit modified from that of FIG. 1. The same parts of FIG. 3 as those of FIG. 1 are denoted by the same numerals. In the logic circuit of FIG. 3, the attenuation in voltage of a "1" output of the NAND circuit 10 can be prevented even without the N-channel transistors 35 and 36 of the clocked inverter 30 of FIG. 1.

In the embodiment of FIG. 4, the operation stabilizing circuit 40 includes an even number (for, example, two) of inverters, namely, a first and a second inverter 20A and 20B, each formed of a P-channel transistor 23 and an N-channel transistor 24 and connected in the cascade form; and a transmission gate 50 for feeding an output signal from the second inverter 20B back to the input of the first inverter 20A, namely, to the output of the NAND circuit 10. The transmission gate 50 consists of a P-channel transistor 51 and an N-channel transistor 52 whose drain-source paths or channels are connected parallel. The transistor 51 has its gate electrode supplied with a clock pulse $\bar{\phi}$ and the transistor 52 has its gate electrode supplied with a clock pulse $\phi$. Both transistors 51 and 52 are rendered conducting during the sampling period to send the output of the second inverter 20B to the output of the NAND circuit 10.

There will now be described the operation of the embodiment of FIG. 4. Where, during the sampling period, the NAND circuit 10 generates a "1" output signal, then the second inverter 20B also gives forth a "1" output signal. The "1" output of the second inverter 20B is added to the output of the NAND circuit 10 through the transmission gate 50, thereby preventing the attenuation in voltage of the "1" output of the NAND circuit 10. Where the NAND circuit 10 delivers a "0" output signal, the "0" output of the second inverter 20B compensates a "0" output of the NAND circuit 10 through the transmission gate 50. One of the transistors 51 and 52 of the transmission gate 50 may be omitted.

In the embodiment of FIG. 5, the logic circuit 110 consists of a two-input NOR circuit. P-channel transistors 114 and 115 and an N-channel transistor 113 are connected in series between a first operating voltage supply point 111 and a second operating voltage supply point 112. The P-channel transistors 114 and 115 have the gate electrodes supplied with data inputs A and B respectively. The N-channel transistor 113 has its gate electrode supplied with a clock pulse $\bar{\phi}$. The first operating voltage supply point 111 is supplied with a clock pulse $\phi$ and the second operating voltage supply point 112 is impressed with a voltage $V_{DD}$ of the zero volt or a clock pulse $\phi$. The same type of operation stabilizing circuit 40 as that of FIG. 1 is connected to the output side of the NOR circuit 110.

During the precharge period, the output point 117 of the NOR circuit 110 is grounded to generate a "0" output voltage. Where, during the sampling period, the transistors 114 and 115 are both rendered nonconducting, a voltage $V_{ss}$ of +E volts is added to the load capacitance CL through its leak resistance Rl. As the result, an output S of the NOR circuit 110 is going to have its voltage raised, as shown in FIG. 6, from the "0" level to the "1" level. However, the rise of voltage level is obstructed by the action of the operation stabilizing circuit 40.

Also in the embodiment of FIG. 5, it is possible to eliminate two transistors in this case, P-channel transistors 33 and 35 of the clocked inverter 30 included in the operation stabilizing circuit 40. Further, the operation stabilizing circuit 40 arranged as shown in FIG. 4 may be used.

In the embodiment of FIG. 7, the clocked inverter 30 of FIG. 1 is supplied with, as shown in FIG. 8, broader clock pulses $\phi_1$ and $\bar{\phi}_1$ than a clock pulse $\phi$. Supply of the broader clock pulses $\phi_1$ and $\bar{\phi}_1$ 1 to the clocked inverter 30 is necessary particularly where the logic transistors 14 and 15 have the channels made narrower, to increase the channel resistances in order to restrict an amount of direct current flow during the sampling period from the operating voltage supply point 31 to the operating voltage supply point 12 or where a plurality of (for example seven or eight) logic transistors are connected in series.

Following is the reason. Where, during the sampling period, the logic transistors 14 and 15 are rendered conducting, the load capacitance CL discharges slowly as shown in FIG. 8, due to its discharge time constant. During the period, therefore, in which the output S of the NAND circuit 10 has its voltage reduced from the "1" level to the "0" level, the inverter 20 generates an output $S_1$ having a "0" voltage level. If, in this case, the clocked inverter 30 receives clock pulses $\phi$ and $\bar{\phi}$ as in FIG. 1, then the clocked inverter 30 which receives a "0" output from the inverter 20 will additionally supply a "1" voltage to the output capacitance CL of the NAND circuit 10. As the result, the output S of the NAND circuit 10 will erroneously indicate, as shown in dotted lines in FIG. 8, a "1" voltage level instead of a "0" voltage level. Naturally, the inverter 20 will also present a false voltage level.

The above-mentioned wrong operation is prevented by supplying the clocked inverter 30 with broader clock pulses $\phi_1$ and $\bar{\phi}_1$ as shown in FIG. 8 until the output S of the NAND circuit 10 has its voltage decreased substantially to the "0" level so as to render the clocked inverter 30 inoperative throughout the precharge period and part of the sampling period.

Prevention of the aforesaid erroneous operation can obviously be attained by supplying such broad clock pulses $\phi_1$ and $\bar{\phi}_1$ as shown in FIG. 8 to the clocked inverter 30 of FIGS. 3 and 5 and the transmission gate 50 of FIG. 4.

FIG. 9 is a circuit diagram of a read only memory provided with the same operation stabilizing circuit as used in FIG. 3. The present invention is particularly suitable for a read only memory having a large number of transistors disposed between the output point 17 and the second operating voltage supply point 12. The read only memory of FIG. 9 has a parallel arrangement of many series connections each consisting of a plurality of N-channel transistors 120. A plurality of data inputs A to H are each supplied to the gate electrode of the respective transistor of the preselected series connections.

All the foregoing embodiments relate to complementary transistor logic circuits consisting of complementary P- and N-channel transistors. However, it is possible to use P- or N-channel transistors alone.

FIGS. 10, 11 and 12 denote the embodiment of this invention using P-channel transistors alone. In the embodiment of FIG. 10, P-channel enhancement type logic transistors 214 and 215 are connected in series to a P-channel enhancement type clocked transistor 213 between a first operating voltage supply point 211 and a second operating voltage supply point 212 to constitute a NAND circuit of positive logic. Cascade connected to the output point 217 are a first inverter 220A and a second inverter 220B each consisting of a P-channel load transistor 223 and an inverting transistor 224. The output terminal of the second inverter 220B is connected to the output point 217 through a P-channel transistor 251 constituting a transmission gate 250. The transistor 251 has its gate electrode supplied with a clock pulse $\bar{\phi}$ or a broader clock pulse $\bar{\phi}_1$ than the clock pulse $\bar{\phi}$. All the P-channel transistors have the substrates grounded.

In the embodiment of FIG. 11, a transistor 260 whose gate electrode is supplied with a clock pulse $\bar{\phi}$ is connected between the transistor 213 and the logic gate 216. A pull-up capacitor 261 is connected between the junction of the transistors 213 and 260 or the output point 217 and the gate electrode of the transistor 260.

Provision of the pull-up capacitor 261 is for the following reason. Where the transmission gate transistor 251 has its gate electrode supplied with the clock pulse $\bar{\phi}_1$, then replenishment of the voltage signal on the output point 17 of the logic circuit is delayed during the sampling period. During this period, therefore, the charge in the load capacitance is likely to decrease due to the charge redistribution or leakage. According to the embodiment of FIG. 11, however, such decrease of charge is prevented by the capacitor 261.

During the precharge period, the transistor 213 is rendered conducting when supplied with a clock pulse $\phi$ having a voltage of +E volts. At this time, the transistor 260 has its gate electrode grounded, causing the capacitor 261 to be positioned parallel with the load capacitance. AS the result, the capacitor 261, together with the load capacitance, is charged up to +E volts. Since, during the sampling period, the gate electrode of the transistor 260 has its voltage raised to +E volts, the voltage at the output point 217 is pulled up to +2E volts. This elevated voltage at the output point 217 prevents the attenuation of an output voltage therefrom.

The above-mentioned pull-up capacitor 261 may be used in the previously described complementary transistor logic circuits. Referring to FIG. 1, for example, it is possible to connect a further N-channel transistor between the output point 17 and logic gate 16, connect a pull-up capacitor between the gate electrode of the N-channel transistor and the output point 17 and supply a clock pulse $\phi$ to the gate electrode of the N-channel transistor.

FIG. 12 shows a circuit diagram of a read only memory according to still another embodiment of this invention which is formed of P-channel transistors alone. Many series connections each consisting of P-channel transistors are arranged parallel between the output point 217 and second operating voltage supply point 212. Data inputs A to H are each supplied to the gate electrode of the respective transistor of the preselected series connections. The output of the second inverter 220B is coupled to the gate electrode of the transistor 234, and a clock pulse $\bar{\phi}$ ($\bar{\phi}_1$) is coupled to the gate of the transistor 233. The transistors 233 and 234 are connected in series between the output point 217 and the operation voltage supply point supplied with a voltage Vss or a clock pulse $\phi$ ($\phi_1$).

In all the foregoing embodiments, a logic circuit was connected between the Vss (+E volts) supply point and the clock pulse supply point. However, it is possible to connect the logic circuit between the Vss supply point and the $V_{DD}$ (ground) supply point. If, in this case, a separate N-channel transistor having its gate electrode supplied with clock pulse $\phi$ is provided between the N-channel transistor 15 and the ground in the embodiment of, for example, FIG. 1, then it will be possible to prevent the flow of direct current from the Vss supply point to the $V_{DD}$ supply point.

What is claimed is:

1. A logic circuit arrangement using insulated gate field effect transistors each provided with a source-drain path and gate electrode, comprising:

a first transistor of first channel type and having its source-drain path connected between a first operating voltage supply point and an output point and its gate electrode supplied with a first clock pulse, said first transistor being rendered conducting during the first section of the cycle of the clock pulse and rendered nonconducting during the second section of said clock pulse cycle following said first section;

a logic gate including at least two second transistors of second channel type opposite to said first channel type, said at least two second transistors having their source-drain paths connected in series between said output point and a second operating voltage supply point, said second transistors having their gate electrodes respectively supplied with data input; and a four transistor clock pulse responsive operation stabilizing circuit means connected to said output point and operative during at least part of the second section of said clock pulse cycle so as to supply said output point with a voltage signal having the same polarity as the voltage signal at said output point, said clock pulse responsive operation stabilizing circuit comprising:

an inverter which includes a third transistor of first channel type and a fourth transistor of second channel type whose gate electrodes are connected to said output point and whose source-drain paths are connected in series between third and fourth operating voltage supply points; and a fifth and a sixth transistor both of first channel type whose source-drain paths are connected in series between said output point and a fifth operating voltage supply point, the gate electrode of said fifth transistor being connected to the junction of the source-drain paths of said third and fourth transistors, and the gate electrode of said sixth transistor being supplied with a second clock pulse;

said third, fourth, fifth and sixth transistors being the only transistors included in said stabilizing circuit.

2. A logic circuit arrangement according to claim 1 including a source of said second clock pulse, said source supplying said second clock pulse to said clock pulse responsive operation stabilizing circuit means with such values that said second clock pulse renders said clock pulse responsive operation stabilizing circuit means inoperative throughout the first section and part of the second section of the cycle of said first clock pulse, and renders same operative during the remainder of the second section of said first clock pulse cycle, thereby supplying the voltage signal to said output point with a time delay.

3. A logic circuit arrangement according to claim 1 including a source of said second clock pulse, said source supplying said second clock pulse to the gate electrode of said sixth transistor, said source supplying said second clock pulse with a broader pulse width than that of said first clock pulse supplied to the gate electrode of said first transistor.

4. A logic circuit arrangement according to claim 1 wherein said transistors of first channel type are P-channel transistors, and wherein said transistors of second channel type are N-channel transistors.

* * * * *